United States Patent
Khurana et al.

(10) Patent No.: US 8,889,558 B2
(45) Date of Patent: Nov. 18, 2014

(54) METHODS OF FORMING A PATTERN ON A SUBSTRATE

(71) Applicant: Micron Technology, Inc., Boise, ID (US)

(72) Inventors: Ranjan Khurana, Boise, ID (US); Anton J. deVillers, Clifton Park, NY (US); Kevin J. Torek, Meridian, ID (US); Shane J. Trapp, Boise, ID (US); Scott L. Light, Boise, ID (US); James M. Buntin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/712,820

(22) Filed: Dec. 12, 2012

(65) Prior Publication Data

US 2014/0162458 A1    Jun. 12, 2014

(51) Int. Cl.
*H01L 21/308* (2006.01)
*B44C 1/22* (2006.01)
*H01L 21/302* (2006.01)

(52) U.S. Cl.
CPC .......... *H01L 21/3086* (2013.01); *H01L 21/302* (2013.01)
USPC ................. 438/696; 216/41; 216/58; 438/694

(58) Field of Classification Search
USPC ................. 438/694, 696; 216/41, 58
See application file for complete search history.

(56) References Cited

U.S. PATENT DOCUMENTS

| | | |
|---|---|---|
| 5,824,587 A | 10/1998 | Krivokapic |
| 6,362,057 B1 | 3/2002 | Taylor et al. |
| 6,403,431 B1 | 6/2002 | Chung et al. |
| 6,521,543 B2 | 2/2003 | Lien |
| 7,175,944 B2 | 2/2007 | Yin et al. |
| 7,786,015 B2 | 8/2010 | Chen et al. |
| 7,790,360 B2 | 9/2010 | Alapati et al. |
| 7,915,171 B2 | 3/2011 | Wallace et al. |
| 7,981,736 B2 | 7/2011 | Juengling |
| 8,026,172 B2 | 9/2011 | Wang et al. |
| 8,039,399 B2 | 10/2011 | Niroomand et al. |
| 8,080,443 B2 | 12/2011 | Chen et al. |
| 8,211,803 B2 | 7/2012 | Sandhu et al. |
| 8,266,558 B2 | 9/2012 | Wells |
| 2006/0011947 A1 | 1/2006 | Juengling |
| 2006/0134448 A1 | 6/2006 | Daniel et al. |
| 2006/0231900 A1 | 10/2006 | Lee et al. |
| 2007/0281219 A1 | 12/2007 | Sandhu |
| 2008/0012056 A1 | 1/2008 | Gonzales |
| 2008/0113483 A1 | 5/2008 | Wells |
| 2008/0254637 A1 | 10/2008 | Hanson et al. |

(Continued)

FOREIGN PATENT DOCUMENTS

WO    WO 2009/126491    10/2009

OTHER PUBLICATIONS

U.S. Appl. No. 13/355,407, filed Jan. 20, 2012, Doebler.
U.S. Appl. No. 13/786,848, filed Mar. 6, 2013, Sipani et al.

(Continued)

*Primary Examiner* — Shamim Ahmed
(74) *Attorney, Agent, or Firm* — Wells St. John, P.S.

(57) ABSTRACT

A method of forming a pattern on a substrate includes forming openings in material of a substrate. The openings are widened to join with immediately adjacent of the openings to form spaced pillars comprising the material after the widening. Other embodiments are disclosed.

48 Claims, 10 Drawing Sheets

(56) References Cited

U.S. PATENT DOCUMENTS

| | | |
|---|---|---|
| 2008/0280444 A1 | 11/2008 | Jung |
| 2009/0068842 A1 | 3/2009 | Kim |
| 2009/0166723 A1 | 7/2009 | Sung et al. |
| 2010/0167520 A1* | 7/2010 | Chen et al. ............ 438/597 |
| 2010/0170868 A1 | 7/2010 | Lin et al. |
| 2010/0216307 A1 | 8/2010 | Niroomand et al. |
| 2010/0221919 A1 | 9/2010 | Lee et al. |
| 2010/0240221 A1 | 9/2010 | Kim et al. |
| 2010/0258966 A1* | 10/2010 | Sandhu ............ 264/104 |
| 2011/0117719 A1 | 5/2011 | Brown et al. |
| 2011/0163420 A1 | 7/2011 | Valdivia et al. |
| 2011/0183269 A1 | 7/2011 | Zhu |
| 2011/0312184 A1 | 12/2011 | Lee et al. |
| 2012/0028476 A1 | 2/2012 | Li et al. |
| 2012/0273131 A1* | 11/2012 | Wells ............ 156/345.3 |
| 2012/0312151 A1 | 12/2012 | Patel |
| 2012/0313151 A1 | 12/2012 | Lee |
| 2013/0295772 A1 | 11/2013 | Kim et al. |

OTHER PUBLICATIONS

U.S. Appl. No. 13/712,806, filed Dec. 12, 2012, Sipani et al.
U.S. Appl. No. 13/712,830, filed Dec. 12, 2012, Trapp et al.
Chapter 2: Crystal Structures and Symmetry; Laue, B; Dec. 28, 2001; 4pp.

* cited by examiner

METHODS OF FORMING A PATTERN ON A SUBSTRATE

TECHNICAL FIELD

Embodiments disclosed herein pertain to methods of forming a pattern on a substrate.

BACKGROUND

Integrated circuits are often formed on a semiconductor substrate such as a silicon wafer or other semiconductive material. In general, layers of various materials which are semiconductive, conductive, or electrically insulative are used to form the integrated circuits. By way of examples, the various materials may be doped, ion implanted, deposited, etched, grown, etc. using various processes. A continuing goal in semiconductor processing is to strive to reduce the size of individual electronic components, thereby enabling smaller and denser integrated circuitry.

One technique for patterning and processing semiconductor substrates is photolithography. Such may include deposition of a patternable masking layer commonly known as photoresist. Such materials can be processed to modify their solubility in certain solvents, and are thereby readily usable to form patterns on a substrate. For example, portions of a photoresist layer can be exposed to actinic energy through openings in a radiation-patterning tool, such as a mask or reticle, to change the solvent solubility of the exposed regions versus the unexposed regions compared to the solubility in the as-deposited state. Thereafter, the exposed or unexposed regions can be removed, depending on the type of photoresist, to leave a masking pattern of the photoresist on the substrate. Adjacent areas of the underlying substrate next to the masked portions can be processed, for example by etching or ion implanting, to effect the desired processing of the substrate adjacent the masking material. In certain instances, multiple different layers of photoresist and/or a combination of photoresists with non-radiation sensitive masking materials are used. Further, patterns may be formed on substrates without using photoresist.

The continual reduction in feature sizes places ever greater demands on the techniques used to form those features. For example, photolithography is commonly used to form patterned features such as conductive lines and arrays of contact openings to underlying circuitry. A concept commonly referred to as "pitch" can be used to describe the sizes of the repeating features in conjunction with spaces immediately adjacent thereto. Pitch may be defined as the distance between an identical point in two neighboring features of a repeating pattern in a straight-line cross section, thereby including the maximum width of the feature and the space to the next immediately adjacent feature. However, due to factors such as optics and light or radiation wavelength, photolithography techniques tend to have a minimum pitch below which a particular photolithographic technique cannot reliably form features. Thus, minimum pitch of a photolithographic technique is an obstacle to continued feature size reduction using photolithography.

Pitch doubling or pitch multiplication is one proposed method for extending the capabilities of photolithographic techniques beyond their minimum pitch. Such typically forms features narrower than minimum photolithography resolution by depositing one or more spacer-forming layers to have a total lateral thickness which is less than that of the minimum capable photolithographic feature size. The spacer-forming layers are commonly anisotropically etched to form sub-lithographic features, and then the features which were formed at the minimum photolithographic feature size are etched from the substrate.

Using such techniques where pitch is actually halved, the reduction in pitch is conventionally referred to as pitch "doubling". More generally, "pitch multiplication" encompasses increase in pitch of two or more times, and also of fractional values other than integers. Thus conventionally, "multiplication" of pitch by a certain factor actually involves reducing the pitch by that factor.

In addition to minimum feature size and placement of such features, it is often highly desirable that the features as-formed be uniform in dimension. Accordingly, uniformity when forming a plurality of features may also be of concern, and is increasingly a challenge as the minimum feature dimensions reduce.

DETAILED DESCRIPTION OF EXAMPLE EMBODIMENTS

Figure 1:
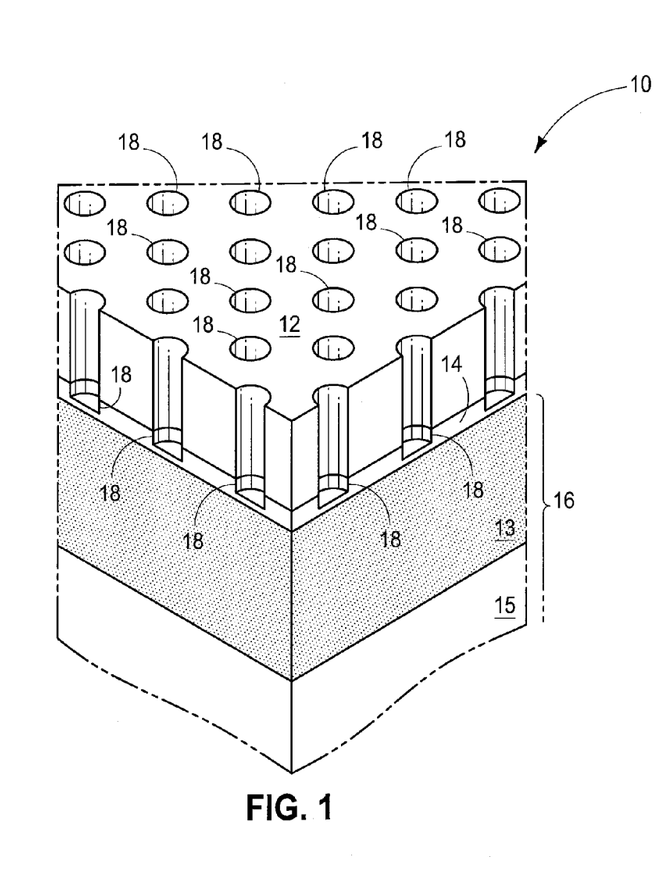
FIG. 1 is a diagrammatic isometric view of a substrate in process in accordance with an embodiment of the invention.

First example embodiments of methods of forming a pattern on a substrate in accordance with the invention are described with reference to FIGS. 1-9. Referring to FIG. 1, a substrate fragment 10 includes first material 12, second material 14, and substrate material 16 elevationally inward of second material 14. Substrate fragment 10 may comprise a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Any of the materials and/or structures described herein may be homogenous or non-homogenous. Further, each may be formed using any suitable existing or yet-to-be-developed technique (with or without plasma), with atomic layer deposition, chemical vapor deposition, and physical vapor deposition being examples.

First material 12 is of different composition from that of second material 14. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. As examples, first material 12 may comprise photoresist and second material 14 may comprise antireflective coating and/or hard-masking material such as $SiO_xN_y$. In one embodiment, substrate material 16 is of different composition from that of second material 14. Example substrate material 16 is shown as comprising a material 13 that is elevationally outward of a material 15. An example material 13 comprises carbon, for example an elevationally outer portion comprising diamond-like carbon and an elevationally inner portion comprising amorphous hard-mask carbon. Material 15, in one example, may be that portion of substrate fragment 10 in which a pattern may be formed from processing relative to materials 12, 14, and 13. Alternately, a pattern may be formed in accordance with some embodiments of the invention with respect to any of materials 12, 14, and/or 13 independent of subsequent processing, if any, relative to an elevationally underlying material 15. Regardless, an example material 15 is doped or undoped silicon dioxide, and one or multiple additional materials may form a part thereof or be elevationally inward thereof.

An array of first openings 18 has been formed through first material 12 and into second material 14. In one embodiment, first openings 18 extend only partially through second material 14. In one embodiment, first openings 18 are formed in an oblique lattice pattern, for example as-shown. Example manners of forming first openings 22 include photolithographic patterning and/or etch. A hard-mask material (not shown) may be formed outwardly of first material 12 or as an outer portion thereof. First openings 18 may be formed at a minimum-photolithographic-capable feature dimension. Alternately, first openings 18 may be formed at greater than a minimum-photolithographic-capable feature dimension, or may be formed to be sub-resolution (e.g., being sub-lithographic such as being formed using pitch multiplication techniques).

Figure 2:
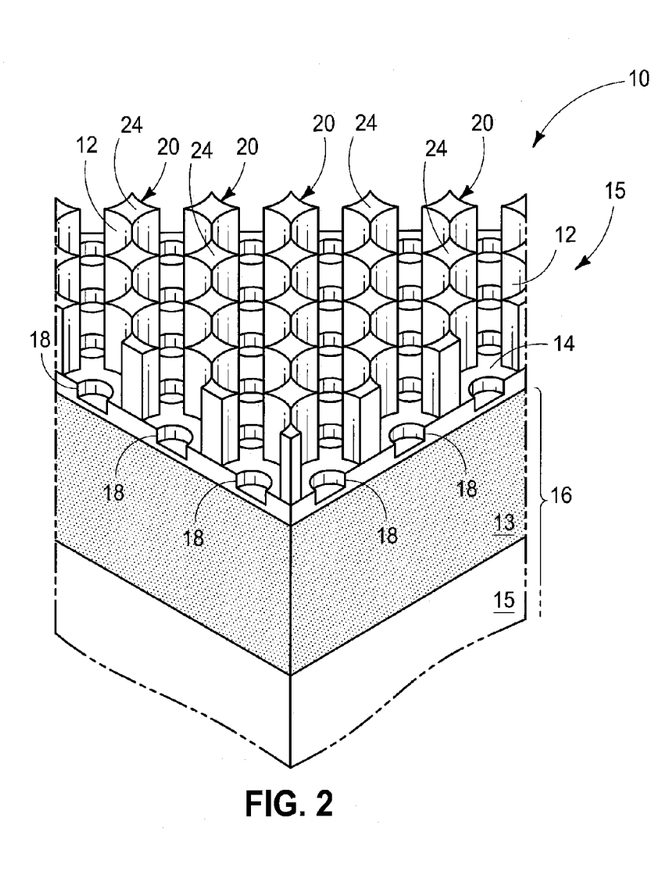
FIG. 2 is a view of the FIG. 1 substrate at a processing step subsequent to that shown by FIG. 1.

Referring to FIG. 2, former first openings 18 (not shown) within first material 12 have been widened to join with immediately adjacent first openings to form spaced pillars 20 comprising remaining first material 12 after the widening. Such may be conducted by an isotropic etch which removes material approximately equally from the sides and top of first material 12. Alternately, chemistry and conditions may be used which tend to etch greater material from the lateral sides of first material 12 than from the top. Alternately, chemistries and conditions may be used which tend to etch greater material from the top of first material 12 than from the lateral sides. For example, isotropic etching may be conducted within an inductively coupled reactor. Example etching parameters which will achieve essentially isotropic etching where first material 12 is photoresist and/or other organic-comprising material are pressure from about 2 mTorr to about 50 mTorr, substrate temperature from about 0° C. to about 110° C., source power from about 150 watts to about 500 watts, and bias voltage at less than or equal to about 25 volts. An example etching gas is a combination of $Cl_2$ from about 20 sccm to about 100 sccm and $O_2$ from about 10 sccm to about 50 sccm. Where first material 12 comprises photoresist, such will isotropically etch at a rate from about 0.2 nanometers per second to about 3 nanometers per second. If even more lateral etching is desired in comparison to vertical etching, example parameter ranges in an inductively coupled reactor include pressure from about 2 mTorr to about 20 mTorr, source power from about 150 watts to about 500 watts, bias voltage at less than or equal to about 25 volts, substrate temperature of from about 0° C. to about 110° C., $Cl_2$ and/or HBr flow from about 20 sccm to about 100 sccm, $O_2$ flow from about 5 sccm to about 20 sccm, and $CF_4$ flow from about 80 sccm to about 120 sccm. Pillars 20 may be considered as comprising tops 24. In one embodiment and as shown, pillars 20 are formed in an oblique lattice pattern, for example where openings 18 of FIG. 1 were formed in an oblique lattice pattern.

The above example processing described with reference to FIGS. 1 and 2 constitutes but one example method of forming a pattern 15 on a substrate independent of subsequent processing. Such a method broadly considered comprises forming openings in material of a substrate. This is followed by widening of those openings to join with immediately adjacent of the openings to form spaced pillars comprising the material in which the openings were formed after the widening, and independent of presence or nature of underlying material 14/16. In one embodiment, the openings prior to the act of widening extend through the material. In one embodiment, the openings prior to the act of widening extend through a first material into a different composition second material (e.g., a first material 12 and a second material 14), and in one embodiment the act of widening is not of those portions of the openings that are in the second material. Regardless, in one embodiment the pillars are individually of quadrilateral cross-sectional shape with concave sidewalls, and in one embodiment individually of rectangular cross-sectional shape. In one embodiment, the substrate comprises another material (e.g., material 16) that is elevationally inward of and of different composition from the second material, with the openings extending only partially into the second material. Alternately, the openings may extend through the second material (not shown with respect to example openings 18 and second material 14). In one embodiment, the pillars are formed to be solid throughout.

Figure 3:
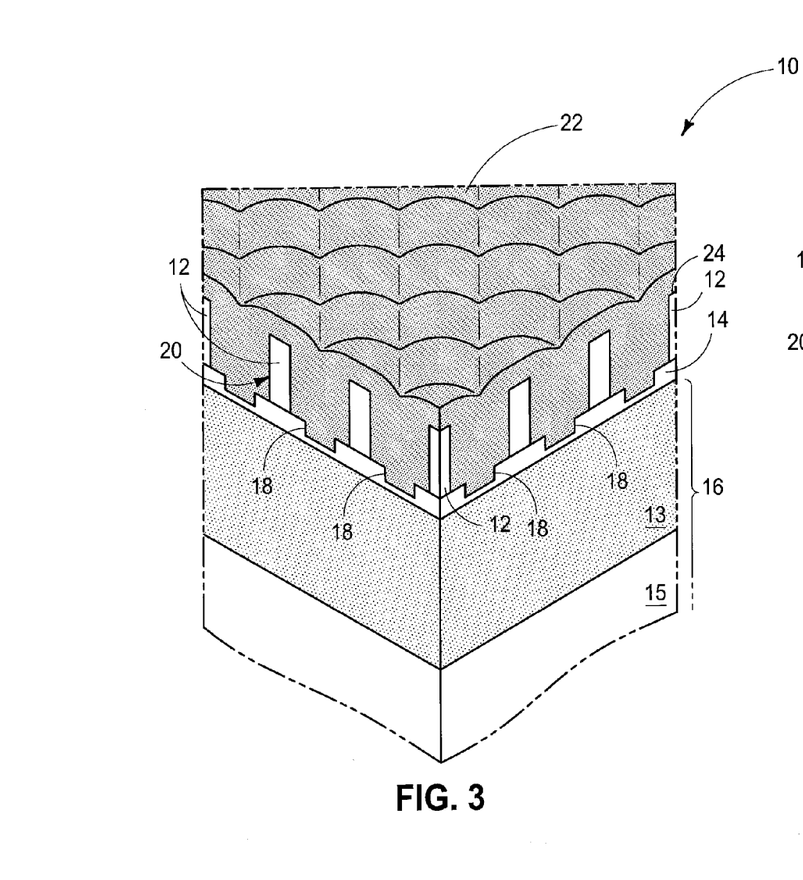
FIG. 3 is a view of the FIG. 2 substrate at a processing step subsequent to that shown by FIG. 2.

Referring to FIG. 3, third material 22 has been formed between pillars 20 elevationally over second material 14. Third material 22 is of different composition from that of first material 12. In one embodiment, third material 22 is of different composition from that of second material 14. An example third material 22 is doped or undoped silicon dioxide. In one embodiment and as shown, third material 22 is also formed elevationally over tops 24 of pillars 20.

Figure 4:
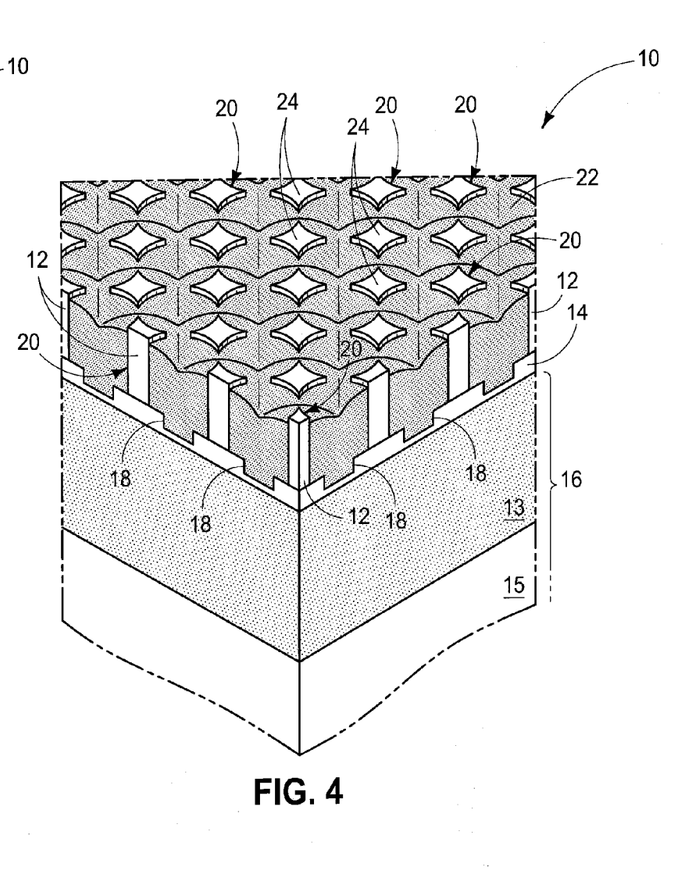
FIG. 4 is a view of the FIG. 3 substrate at a processing step subsequent to that shown by FIG. 3.

Referring to FIG. 4, third material 22 has been removed back sufficiently to expose pillars 20. Such may occur, for example, by blanket etching and/or chemical mechanical polishing. Removal of third material 22 may occur selectively relative to material 12 of pillars 20. In this document, a "selective" removal requires removal of one material relative to another stated material at a rate of at least 2:1.

Figure 5:
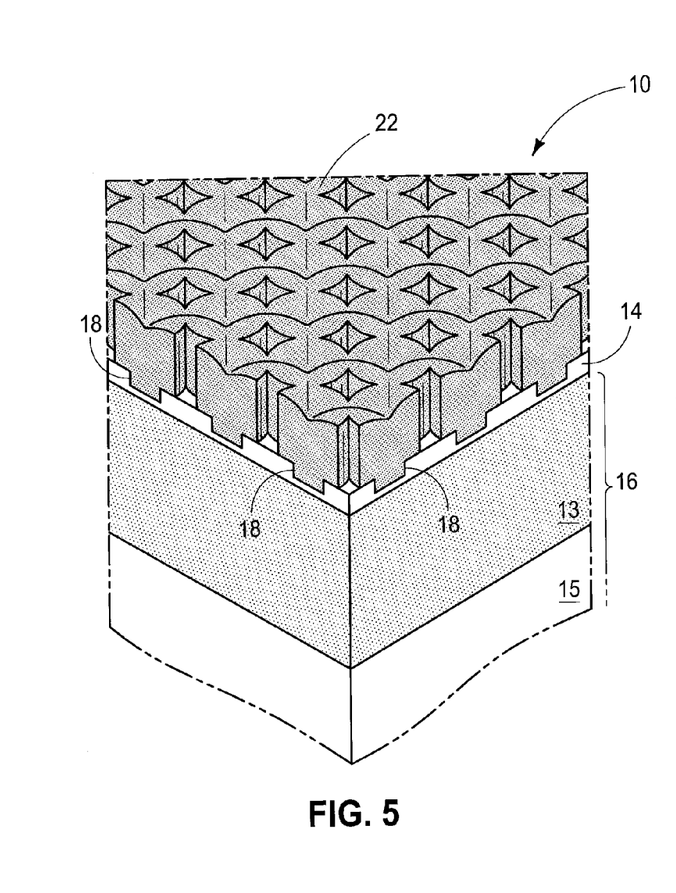
FIG. 5 is a view of the FIG. 4 substrate at a processing step subsequent to that shown by FIG. 4.

Referring to FIG. 5, pillars 20 (not shown) have been removed. In some embodiments, such may occur by etching pillar material 12 (not shown) and selectively relative to third material 22 and/or selectively relative to second material 14.

Figure 6:
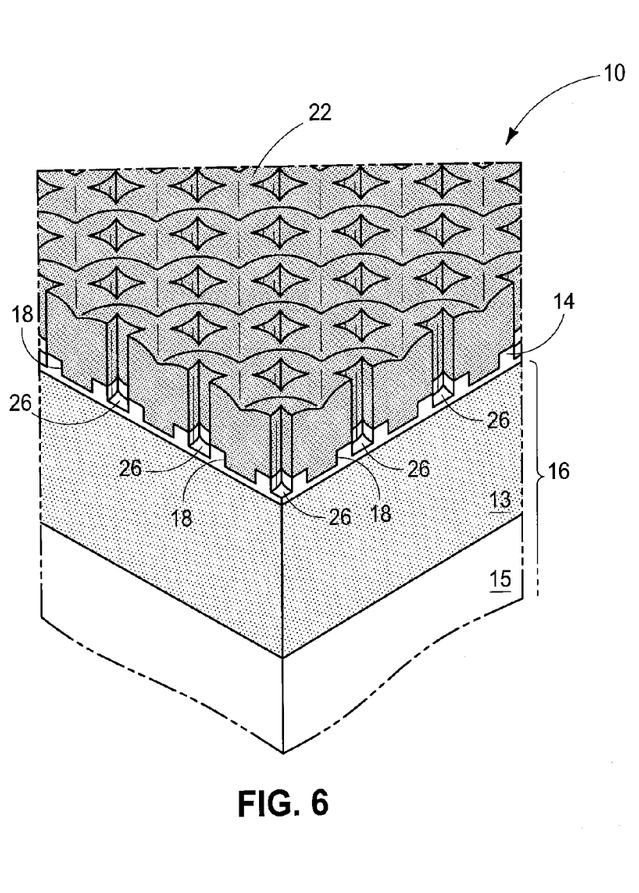
FIG. 6 is a view of the FIG. 5 substrate at a processing step subsequent to that shown by FIG. 5.

Referring to FIG. 6, third material 22 has been used as a mask while forming second openings 26 into second material 14 where pillars 20 (not shown) were removed. Such may occur by etching. In one embodiment, forming of second openings 26 occurs by removing second material 14 selectively relative to third material 22, for example by etching. Depending on material composition and selected etching chemistry, a single etching chemistry and step may be used in removing the pillars and etching into second material 14. Alternately as an example, pillars 20 (not shown) may be removed selectively relative to second material 14, and etching conditions and/or chemistry changed for etching into second material 14 there-after. In one embodiment and as shown, second openings 26 are formed to extend only partially through second material 14. Alternately, one or both of first openings 18 and second openings 26 may be etched to extend completely through second material 14 (not shown) at this point in the process.

Figure 7:
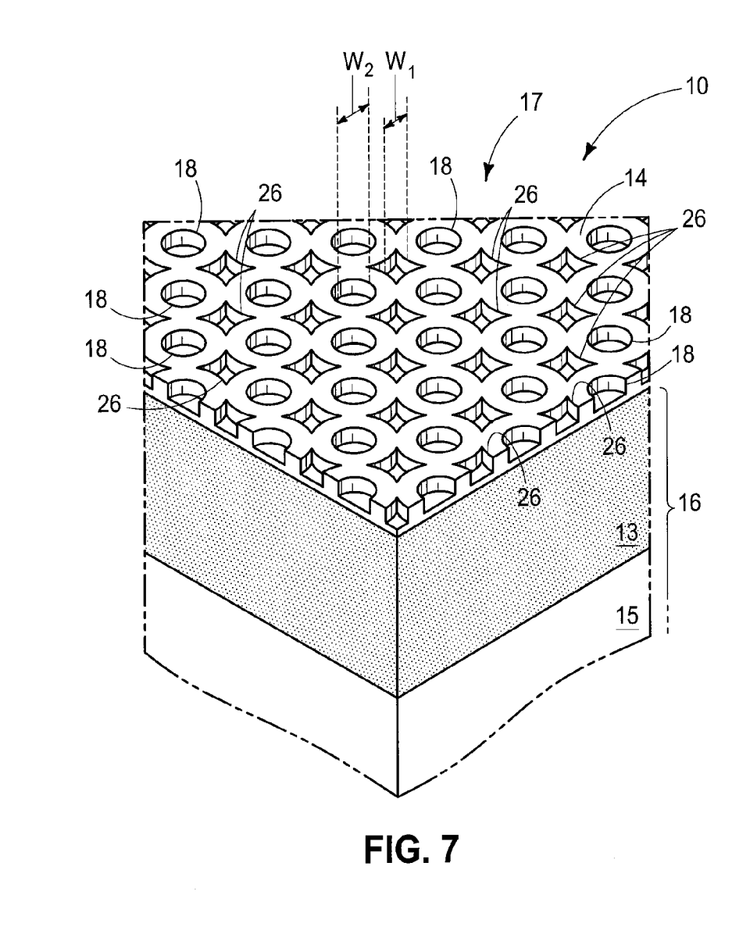
FIG. 7 is a view of the FIG. 6 substrate at a processing step subsequent to that shown by FIG. 6.

Referring to FIG. 7, third material 22 (not shown) has been removed from over second material 14 after the forming of second openings 26, thereby forming a depicted example pattern 17 on the substrate independent of subsequent processing, if any. In one embodiment where photomasking is used, first openings 18 and second openings 26 have been formed in two different etching steps using only a single photomasking step. In one embodiment and as shown, first openings 18 form a prior oblique lattice pattern (FIG. 1) and second openings 26 in combination with first openings 18 form a later square lattice pattern (FIG. 7).

Some embodiments of methods of forming a pattern on a substrate in accordance with the invention encompass forming spaced pillars projecting elevationally outward of masking material that is over a substrate. For example, pillars 20 in FIG. 2 may be considered as projecting elevationally outward of masking material in the form of second material 14 that is over a substrate 16, and independent of how second pillars 20 are formed. Fill material is formed between the pillars elevationally over the masking material. For example, third material 22 in the depicted embodiment may be considered as fill material. In this document, a stated "fill material" completely fills void space that is between the pillars. After the fill material is formed, the pillars are removed. First and second openings are ultimately formed in the masking material, for example first openings 18 and second openings 26 regardless of order of formation. In other words, some or all of individual first openings 18 may be formed before forming some or all of individual second openings 26, some or all of individual second openings 26 may be formed before forming some or all of individual first openings 18, or some or all of the first and second openings 18, 26 may be formed largely simultaneously. Regardless, forming of the second openings may comprise using the fill material as an etch mask while etching the second openings into the masking material where the pillars were removed. The first openings are formed in the masking material laterally of the second openings regardless of when formed. After the first and second openings are formed, the fill material is removed from being over the masking material. In one embodiment, the first openings are formed before forming the second openings, in one embodiment before removing the pillars, and in one embodiment before forming the fill material with the fill material then filling the first openings. In one embodiment, the second openings have respective shorter minimum open dimensions at an elevationally outermost surface of the masking material (e.g., $W_1$ in FIG. 7) than those of the first openings (e.g., $W_2$). Any other attribute as described above may be used.

Figure 8:
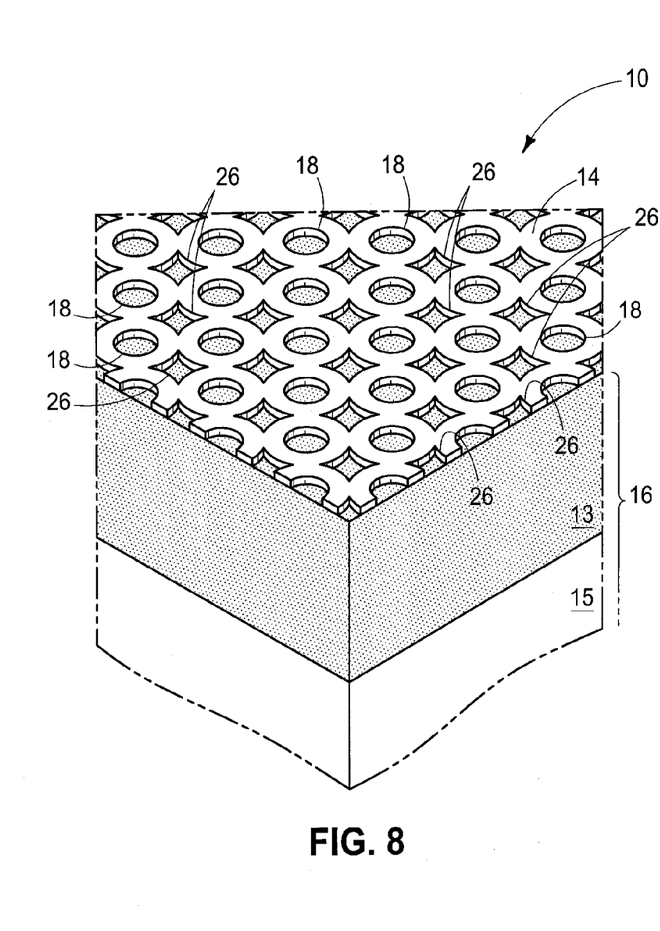
FIG. 8 is a view of the FIG. 7 substrate at a processing step subsequent to that shown by FIG. 7.

Referring to FIG. 8, second material 14 has been etched to extend first openings 18 and second openings 26 therethrough. If second material 14 is over substrate area outside of an array area or other target area of interest in which openings 18 and 26 are formed, that substrate area may be masked while extending openings 18 and 26 through second material 14 within the target area.

Figure 9:
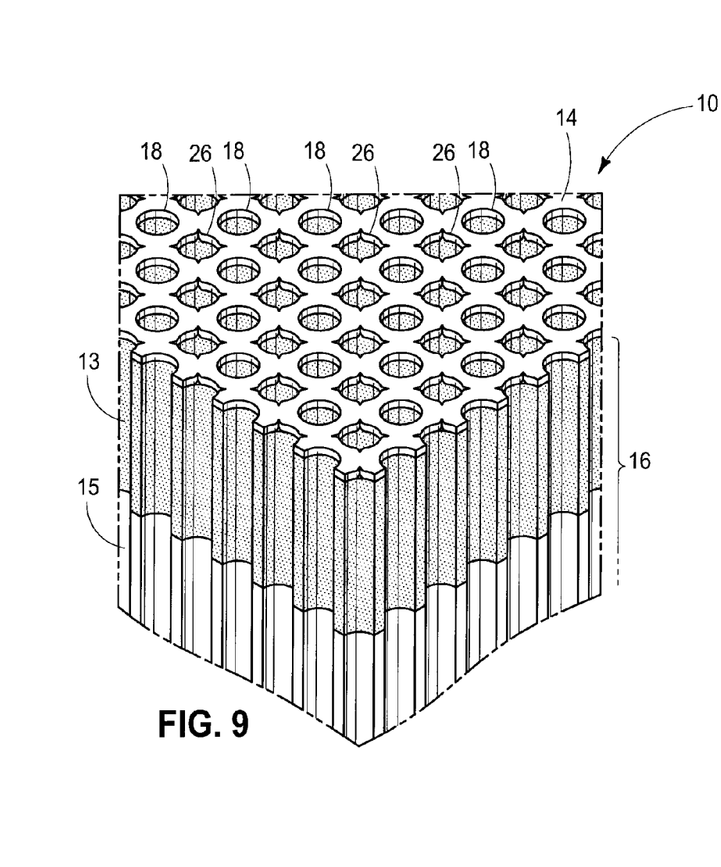
FIG. 9 is a view of the FIG. 8 substrate at a processing step subsequent to that shown by FIG. 8.

Second material 14 of FIGS. 7 and/or 8 may be used as a mask while processing substrate material beneath the second material through the first and second openings that are in the second material, for example as a mask for ion implanting, diffusion doping, or etching into underlying material. As an example, FIG. 9 shows example subsequent processing wherein second material 14 of FIG. 8 has been used as an etch mask while etching into substrate material 13 and/or 15 through first openings 18 and second openings 26. The above-described processing may have a tendency to round-out openings 26, for example as shown. The openings formed in substrate material 13/15 may be used as contact openings, capacitor electrode openings, and/or for forming programmable portions of two-electrode memory cells, by way of examples only.

Figure 10:
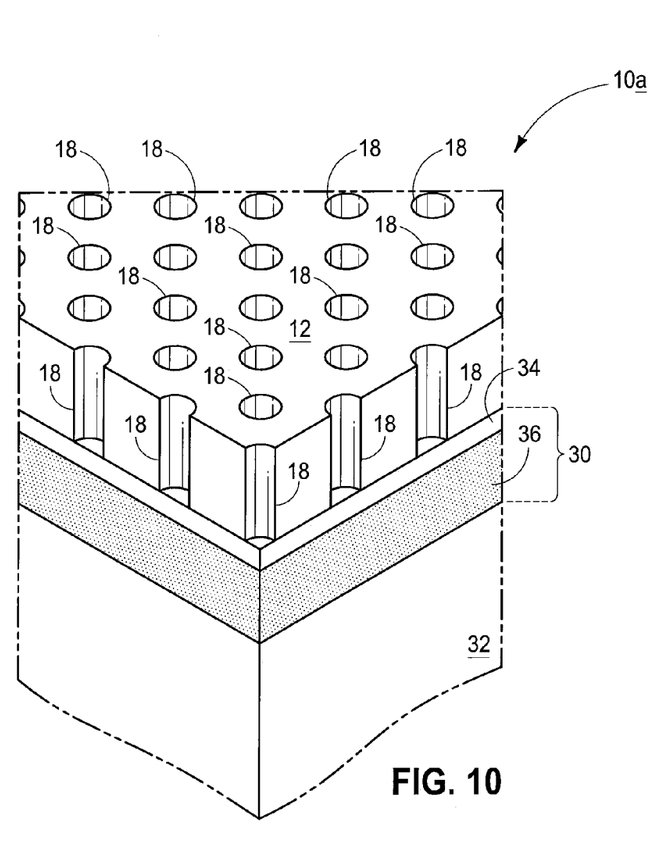
FIG. 10 is a diagrammatic isometric view of a substrate in process in accordance with an embodiment of the invention.

Additional embodiments of methods of forming a pattern on a substrate are next described with respect to a substrate fragment 10*a* shown in FIGS. 10-19. Like numerals from the above described embodiments have been used where appropriate, with some construction differences being indicated with the suffix "a" or with different numerals. Referring to FIG. 10, substrate fragment 10*a* comprises first material 12, second material 30, and substrate material 32 elevationally inward of second material 30. Second material 30 is of different composition from that of first material 12, and substrate material 32 is of different composition from that of second material 30. In one embodiment, second material 30 comprises elevationally outer material 34 and elevationally inner material 36 which are of different composition relative one another. An example elevationally outer material is hard-masking material and/or antireflective material, for example $Si_xO_yN_z$. An example inner material 36 comprises diamond-like carbon. Openings 18 have been formed in first material 12 of substrate 10*a*. In one embodiment and as shown, and in contradistinction to some embodiments as described above, openings 18 in first material 12 do not extend into underlying second material (i.e., second material 14 in FIGS. 1-9 and second material 30 in FIG. 10).

Figure 11:
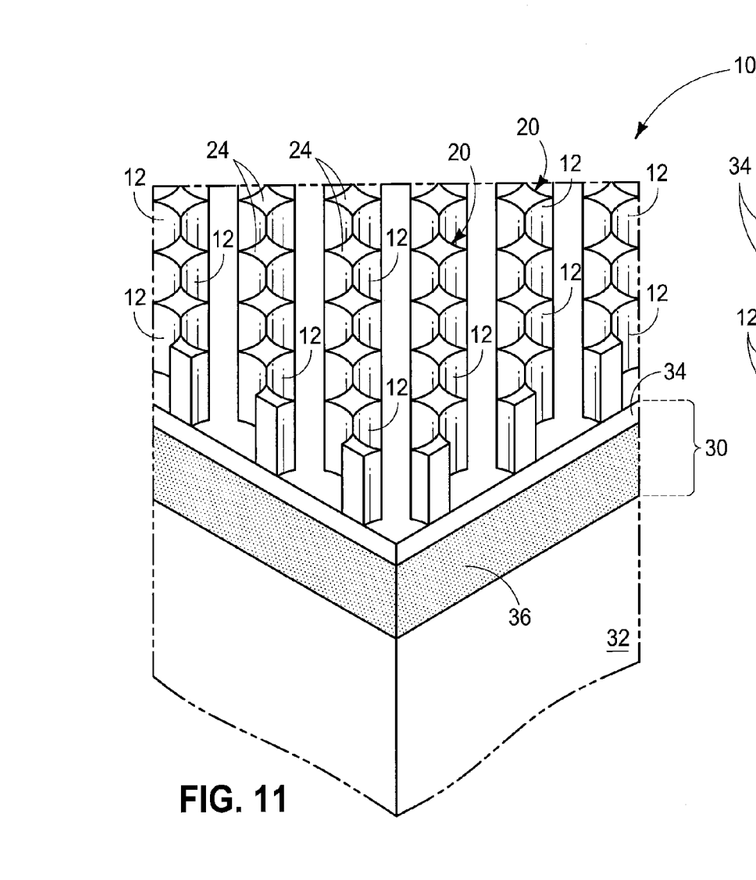
FIG. 11 is a view of the FIG. 10 substrate at a processing step subsequent to that shown by FIG. 10.

Referring to FIG. 11, openings 18 (not shown) have been widened to join with immediately adjacent of such openings to form spaced first material-comprising pillars 20. The first material-comprising pillars are used as a mask while etching into the second material to form second material-comprising pillars. Example embodiments for doing so where the second material comprises different composition elevationally outer and inner materials are described with reference to FIGS. 12 and 13.

Figure 12:
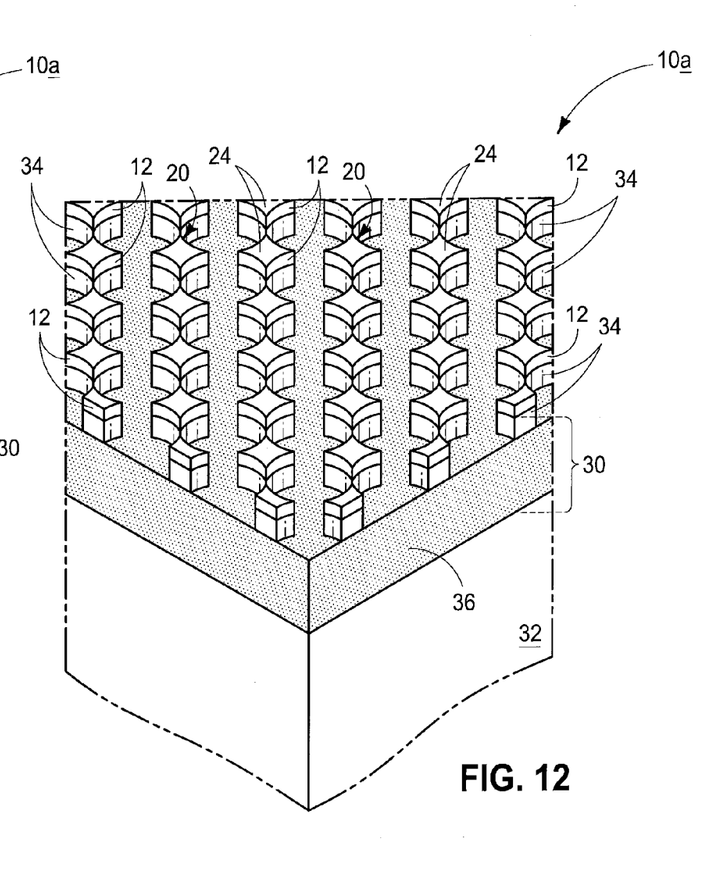
FIG. 12 is a view of the FIG. 11 substrate at a processing step subsequent to that shown by FIG. 11.

Referring to FIG. 12, first material-comprising pillars 20 have been used as a mask while etching outer material 34 selectively relative to inner material 36. First material-comprising pillars 20 may be reduced in thickness by such processing, for example as shown.

Figure 13:
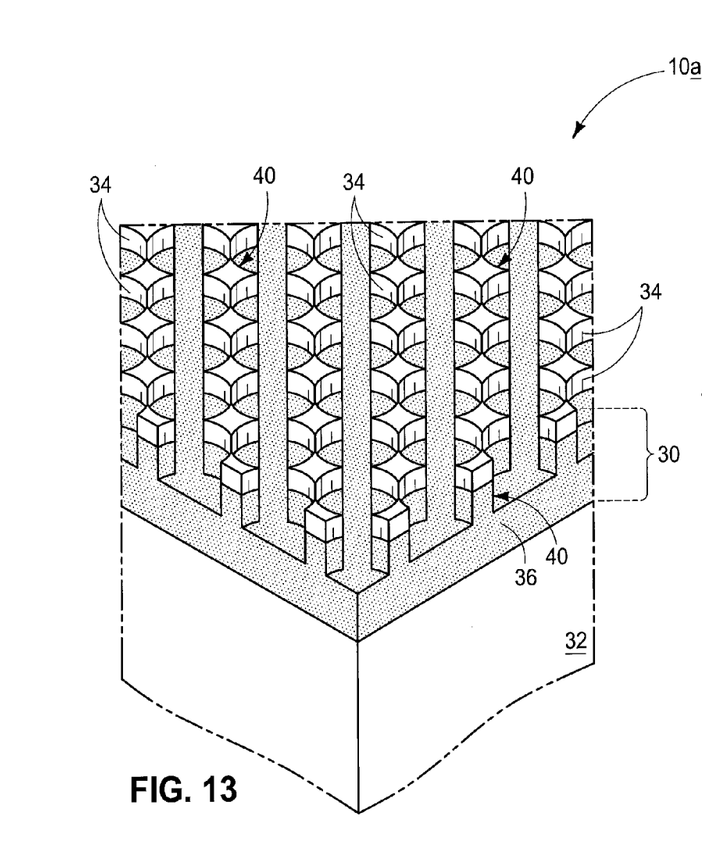
FIG. 13 is a view of the FIG. 12 substrate at a processing step subsequent to that shown by FIG. 12.

Referring to FIG. 13, inner material 36 has been etched, and in one embodiment selectively relative to outer material 34, to form second material-comprising pillars 40. In one embodiment and as shown, at conclusion of forming second material-comprising pillars 40, none of first material 12 (not shown) remains over pillars 40. In one embodiment, the etching into second material 30 to form second material-comprising pillars 40 does not etch completely through second material 30, thereby forming second material-comprising pillars 40 to project integrally elevationally outward from second material 30.

Figure 14:
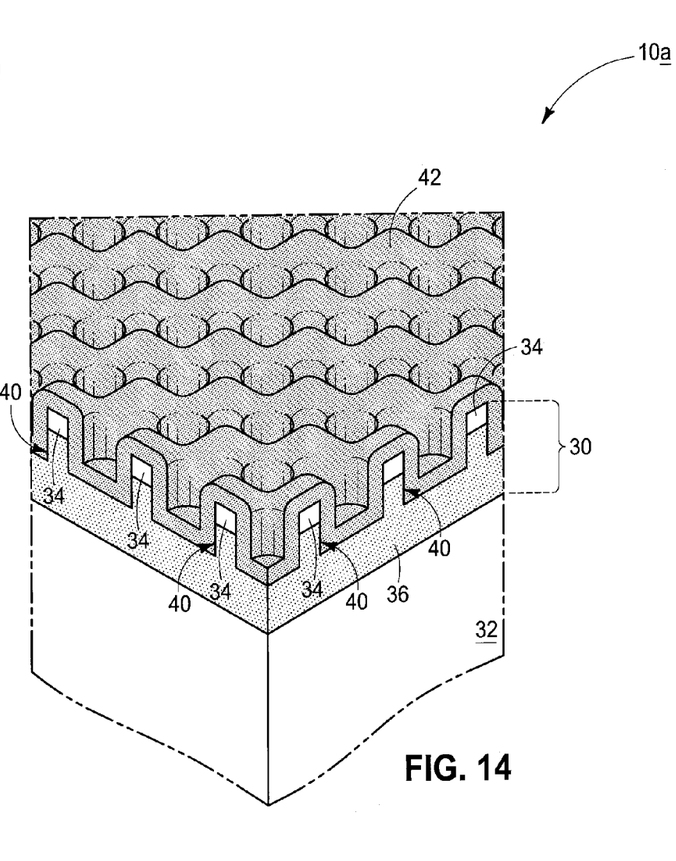
FIG. 14 is a view of the FIG. 13 substrate at a processing step subsequent to that shown by FIG. 13.

Sidewall spacers are formed over sidewalls of the second material-comprising pillars. One technique for doing so is shown and described with reference to FIGS. 14 and 15. Referring to FIG. 14, a spacer-forming material 42 has been deposited over tops and sidewalls of pillars 40 and over second material 30 between pillars 40. An example material 42 is doped or undoped silicon dioxide.

Figure 15:
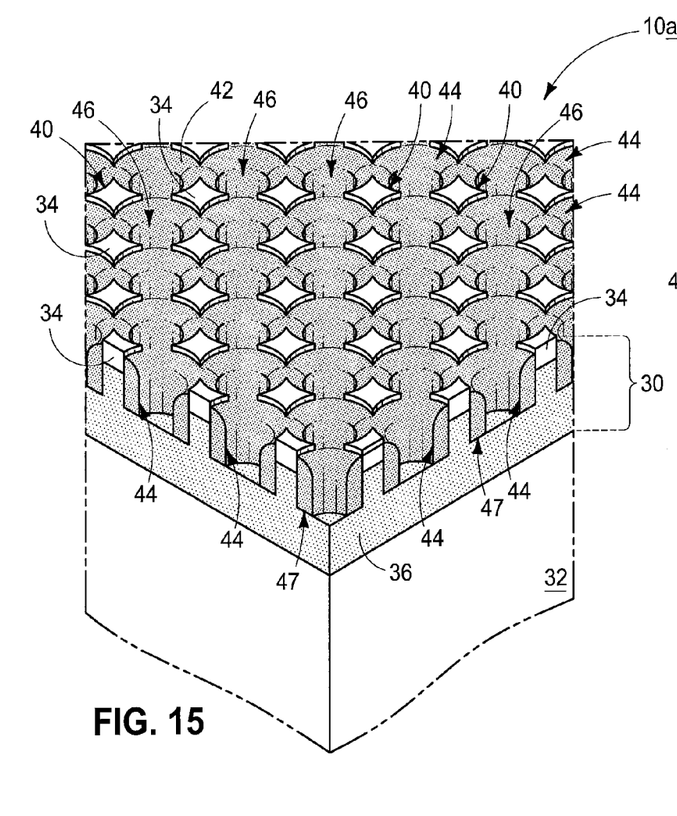
FIG. 15 is a view of the FIG. 14 substrate at a processing step subsequent to that shown by FIG. 14.

Referring to FIG. 15 spacer-forming material 42 has been anisotropically etched to form sidewall spacers 44. Interstitial spaces 46 are formed by sidewall spacers 44 laterally outward of pillars 40. Interstitial spaces 46 are individually surrounded by longitudinally-contacting sidewall spacers 44 that are over sidewalls of four of pillars 40. Sidewall spacers 44 may be considered as comprising bases 47.

Figure 16:
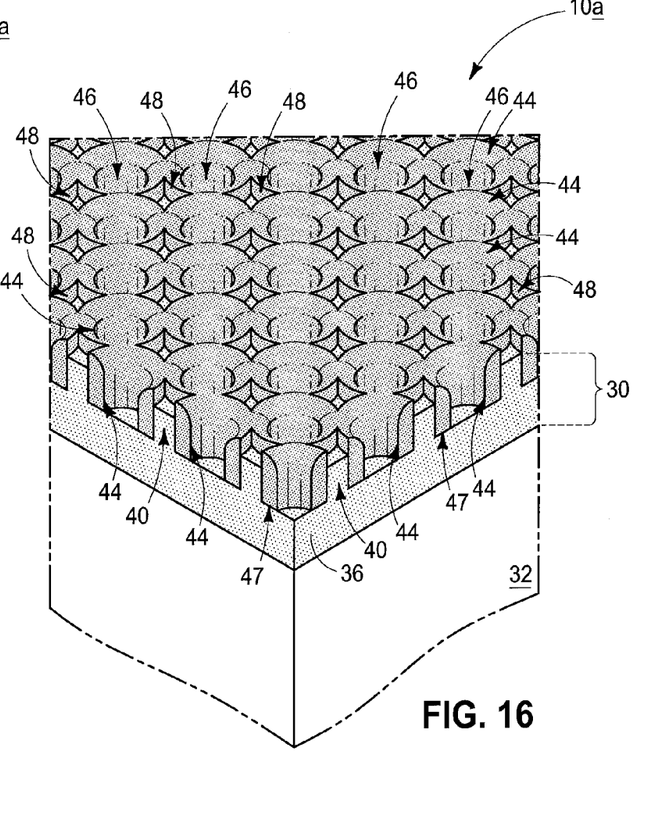
FIG. 16 is a view of the FIG. 15 substrate at a processing step subsequent to that shown by FIG. 15.

The second material-comprising pillars are removed to form a pattern comprising the sidewall spacers. The pattern has openings therein where the second material-comprising pillars were removed and has the interstitial spaces. Example embodiments for doing so, particularly where second material 30 comprises different composition inner and outer materials, are described with reference to FIGS. 16 and 17. Referring to FIG. 16, outer material 34 (not shown) has been removed, and in one embodiment selectively relative to inner material 36. Regardless, if desired, an optional cut masking and etching step (not shown) may be performed prior to the FIG. 16 processing over substrate area outside of an array or other target area in which a desired pattern is being formed.

Figure 17:
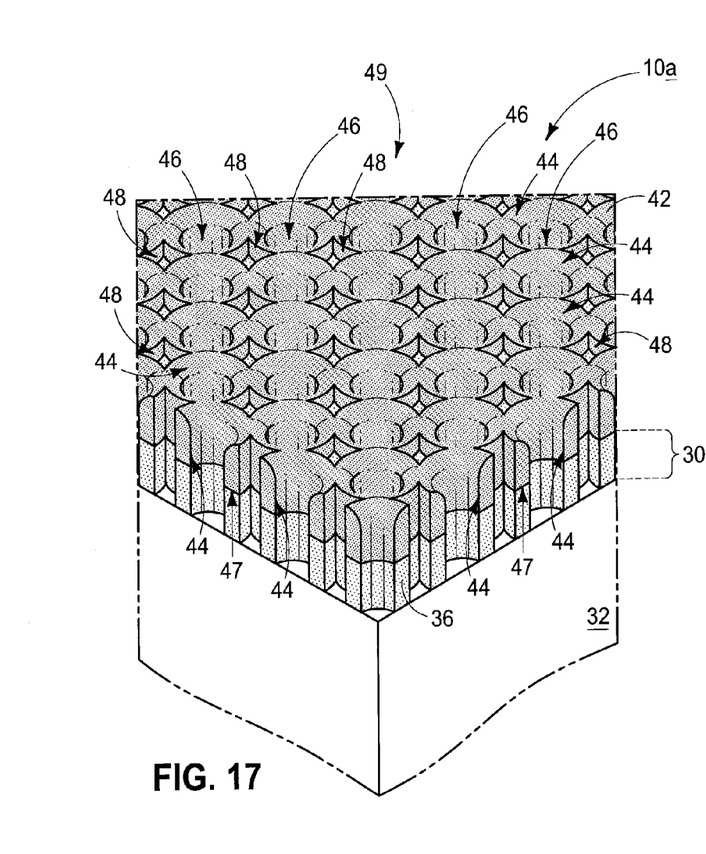
FIG. 17 is a view of the FIG. 16 substrate at a processing step subsequent to that shown by FIG. 16.
Figure 18:
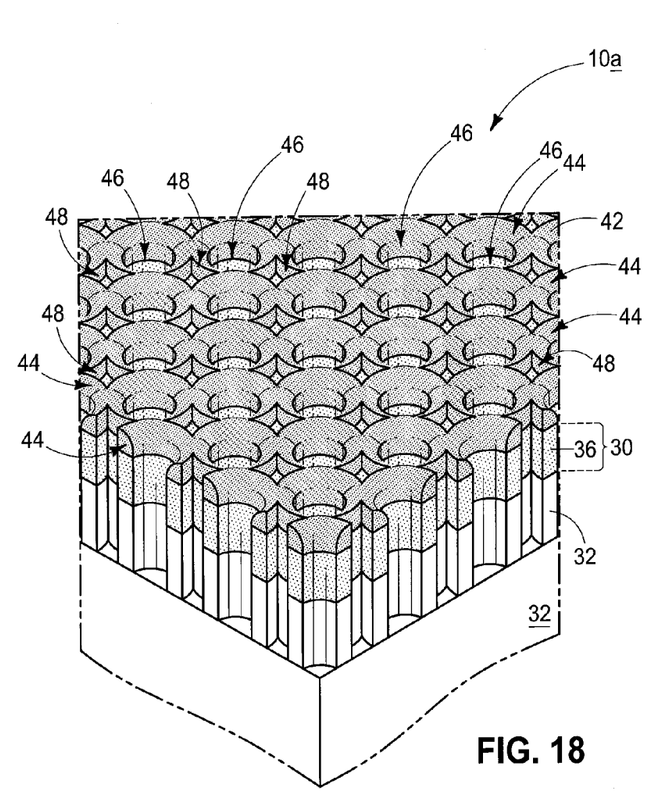
FIG. 18 is a view of the FIG. 17 substrate at a processing step subsequent to that shown by FIG. 17.

Referring to FIG. 17, inner material 36 has been etched at least to bases 47 of sidewall spacers 44, and in one embodiment as shown by etching completely through remaining second material 30 (i.e., through inner material 36) to substrate material 32. Regardless, a pattern 49 has been formed in FIG. 17 which comprises sidewall spacers 44 having openings 48 therein where second material-comprising pillars 40 (not shown) were removed and having interstitial spaces 46, and regardless of any subsequent processing.

In one embodiment, sidewall spacers 44 are used as a mask while processing substrate material elevationally inward of sidewall spacers 44 through openings 48 and spaces 46, for example as a mask for ion implanting, diffusion doping, or etching into underlying material. FIG. 17 may be considered one such embodiment wherein etching has occurred into remaining second material 30 (i.e., elevationally inner material 36) which is elevationally inward of sidewall spacers 44. Regardless, FIG. 18 also shows additional such processing occurring by etching into material 32. (Elevational thickness of sidewall spacers 44 may be reduced, for example as shown.) Alternately as an example, sidewall spacers 44 might be removed at the conclusion of the FIG. 17 processing, and remaining second material 30 (e.g., material 36) used as a mask for processing underlying substrate material through openings therein.

Figure 19:
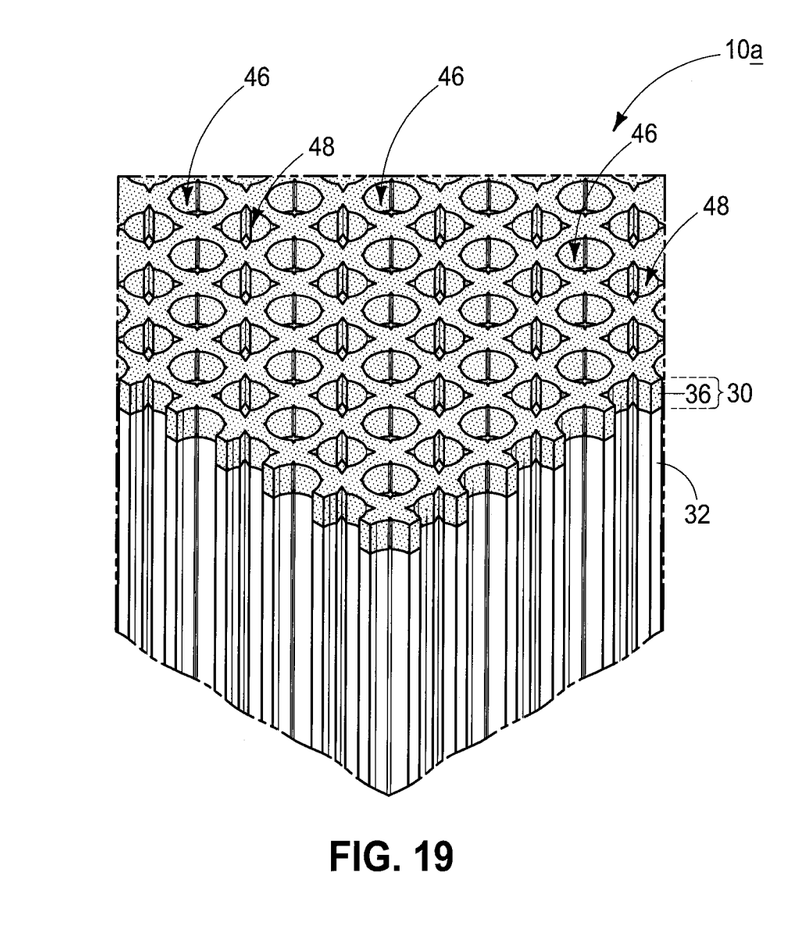
FIG. 19 is a view of the FIG. 18 substrate at a processing step subsequent to that shown by FIG. 18.

FIG. 19 shows example subsequent processing whereby sidewall spacers 44 (not shown) have been removed. Thickness of remaining second material 30 (e.g., material 36) may be reduced. An outer portion of material 32 may comprise one or more hard-masking materials which may be used in further transfer of the resultant pattern to material inwardly thereof (not shown). Any other attribute as described above with respect to the first embodiments of FIGS. 1-9 may be used in the embodiments of FIGS. 10-19.

The processing shown and described above with respect to FIGS. 10-19 are but example embodiments of a method of forming a pattern on a substrate. Such method comprises forming spaced pillars (e.g., pillars 40) projecting elevationally outward of a substrate, and independent of how those spaced pillars are formed. Sidewall spacers (e.g., spacers 44) are formed over sidewalls of the pillars. The sidewall spacers form interstitial spaces (e.g., interstitial spaces 46) laterally outward of the pillars, and which are individually surrounded by longitudinally-contacting sidewall spacers that are over sidewalls of four of the pillars. After forming the sidewall spacers, the pillars are removed. Thereafter, material that is elevationally inward of the sidewall spacers is etched through openings where the pillars were removed and through the interstitial spaces using the sidewall spacers as an etch mask. Any other attribute as described above may be used.

CONCLUSION

In some embodiments, a method of forming a pattern on a substrate comprises forming openings in material of a substrate. The openings are widened to join with immediately adjacent of the openings to form spaced pillars comprising the material after the widening.

In some embodiments, a method of forming a pattern on a substrate comprises forming spaced pillars projecting elevationally outward of masking material that is over a substrate. Fill material is formed between the pillars elevationally over the masking material. After forming the fill material, the pillars are removed. First and second openings are formed in the masking material. The forming of the second openings comprises using the fill material as an etch mask while etching the second openings into the masking material where the pillars were removed. The first openings in the masking material are lateral of the second openings. After forming the first and second openings, the fill material is removed from being over the masking material.

In some embodiments, a method of forming a pattern on a substrate comprises forming first openings through first material and into second material of a substrate. The first material is of different composition from that of the second material. The first openings in the first material are widened to join with immediately adjacent first openings in the first material to form spaced pillars comprising remaining first material after the widening. Third material is formed between the pillars elevationally over the second material. The third material is of different composition from that of the first material. After forming the third material, the pillars are removed. The third material is used as a mask while forming second openings into the second material where the pillars were removed. The remaining third material is removed from over the second material after forming the second openings in the second material.

In some embodiments, a method of forming a pattern on a substrate comprises forming spaced pillars projecting elevationally outward of a substrate. Sidewall spacers are formed over sidewalls of the pillars. The sidewall spacers form interstitial spaces laterally outward of the pillars. The interstitial spaces are individually surrounded by longitudinally-contacting sidewall spacers that are over sidewalls of four of the pillars. The pillars are removed after forming the sidewall spacers. After removing the pillars, material elevationally inward of the sidewall spacers is etched into where the pillars were removed and through the interstitial spaces using the sidewall spacers as an etch mask.

In some embodiments, a method of forming a pattern on a substrate comprises forming openings in first material of a substrate. The openings are widened to join with immediately adjacent of the openings to form spaced first material-comprising pillars. The first material-comprising pillars are used as a mask while etching into second material to form second material-comprising pillars. The second material is elevationally inward of the first material and is of different composition from that of the first material. Sidewall spacers are formed over sidewalls of the second material-comprising pillars. The sidewall spacers form interstitial spaces laterally outward of the second material-comprising pillars. The interstitial spaces are individually surrounded by longitudinally-contacting sidewall spacers that are over sidewalls of four of the second material-comprising pillars. After forming the sidewall spacers, the second material-comprising pillars are removed to form a pattern comprising the sidewall spacers having openings therein where the second material-comprising pillars were removed and having the interstitial spaces.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a pattern on a substrate, comprising:
   forming openings in material of a substrate, the material in which the openings are formed being laterally continuous laterally outside of and among the openings over a region of the substrate after forming the openings; and
   widening the openings to join with immediately adjacent of the openings to form spaced pillars comprising the material after the widening.

2. The method of claim 1 wherein the pillars are individually of quadrilateral cross-sectional shape with concave sidewalls.

3. The method of claim 2 wherein the pillars are individually of rectangular cross-sectional shape.

4. The method of claim 1 wherein the material in which the openings are formed comprises first and second different composition materials, the first material being elevationally outward of the second material, the openings prior to the widening extending through the first material and into the second material.

5. The method of claim 4 wherein the widening is not of those portions of the openings that are in the second material.

6. The method of claim 4 wherein the substrate comprises a third material different in composition from that of the second material and elevationally inward of the second material, the openings prior to the widening only extending partially into the second material.

7. A method of forming a pattern on a substrate, comprising:
   forming spaced pillars projecting elevationally outward of masking material that is over a substrate;
   forming fill material between the pillars elevationally over the masking material;
   after forming the fill material, removing the pillars;
   forming first and second openings in the masking material, the forming of the second openings comprising using the fill material as an etch mask while etching the second openings into the masking material elevationally directly beneath locations from which the pillars were removed, the first openings in the masking material being lateral of the second openings; and
   after forming the first and second openings, removing the fill material from being over the masking material.

8. The method of claim 7 comprising forming the first openings before forming the second openings.

9. The method of claim 8 comprising forming the first openings before removing the pillars.

10. The method of claim 9 comprising forming the first openings before forming the fill material, the fill material filling the first openings.

11. The method of claim 7 comprising forming the fill material elevationally over tops of the pillars.

12. The method of claim 7 wherein the second openings extend only partially through the masking material.

13. The method of claim 7 wherein the first openings extend only partially through the masking material.

14. The method of claim 7 wherein the second openings have shorter minimum open dimensions at an elevationally outermost surface of the masking material than those of the first openings.

15. The method of claim 7 further comprising:
   after removing the fill material, using the masking material as a mask while processing substrate material beneath the masking material through the first and second openings in the masking material.

16. The method of claim 7 comprising forming the pillars to be solid throughout.

17. The method of claim 7 comprising forming the first openings in an oblique lattice pattern and forming a combination of the first and second openings in a square lattice pattern.

18. The method of claim 7 comprising photomasking, the forming of the first and second openings being formed in two different etching steps using only a single photomasking step.

19. A method of forming a pattern on a substrate, comprising:
   forming first openings through first material and into second material of a substrate, the first material being of different composition from that of the second material, the first material and the second material in which the first openings are formed being laterally continuous laterally outside of and among the first openings over a region of the substrate after forming the first openings;
   widening the first openings in the first material to join with immediately adjacent first openings in the first material to form spaced pillars comprising remaining first material after the widening;
   forming third material between the pillars elevationally over the second material, the third material being of different composition from that of the first material;
   after forming the third material, removing the pillars;

using the third material as a mask while forming second openings into the second material elevationally directly beneath locations from which the pillars were removed; and removing remaining third material from over the second material after forming the second openings in the second material.

20. The method of claim 19 wherein the third material is of different composition from that of the second material.

21. The method of claim 19 comprising substrate material elevationally inward of the second material which is of different composition from that of the second material, the first openings extending only partially through the second material.

22. The method of claim 19 comprising substrate material elevationally inward of the second material which is of different composition from that of the second material, the second openings extending only partially through the second material.

23. The method of claim 19 comprising substrate material elevationally inward of the second material which is of different composition from that of the second material, the first and second openings extending only partially through the second material, and further comprising:

after the removing of remaining third material, etching the second material to extend the first and second openings there-through.

24. The method of claim 19 further comprising:

after removing the remaining third material, using the second material as a mask while processing substrate material beneath the second material through the first and second openings in the second material.

25. The method of claim 24 wherein the processing comprises etching into substrate material beneath the second material through the first and second openings in the second material.

26. A method of forming a pattern on a substrate, comprising:

forming spaced pillars projecting elevationally outward of a substrate;

forming sidewall spacers over sidewalls of the pillars, the sidewall spacers forming interstitial spaces laterally outward of the pillars, the interstitial spaces being individually surrounded by longitudinally-contacting sidewall spacers that are over sidewalls of four of the pillars;

removing the pillars after forming the sidewall spacers; and after removing the pillars, etching into material elevationally inward of the sidewall spacers elevationally directly beneath locations from which the pillars were removed and through the interstitial spaces using the sidewall spacers as an etch mask.

27. The method of claim 26 comprising forming the pillars over which the sidewall spacers are formed to comprise different composition elevationally outer and inner materials.

28. The method of claim 27 wherein the removing of the pillars comprises:

etching the outer material selectively relative to the inner material; and thereafter, etching the inner material.

29. A method of forming a pattern on a substrate, comprising:

forming openings in first material of a substrate, the first material in which the openings are formed being laterally continuous laterally outside of and among the openings over a region of the substrate after forming the openings;

widening the openings to join with immediately adjacent of the openings to form spaced first material-comprising pillars;

using the first material-comprising pillars as a mask while etching into second material to form second material-comprising pillars, the second material being elevationally inward of the first material and being of different composition from that of the first material;

forming sidewall spacers over sidewalls of the second material-comprising pillars, the sidewall spacers forming interstitial spaces laterally outward of the second material-comprising pillars, the interstitial spaces being individually surrounded by longitudinally-contacting sidewall spacers that are over sidewalls of four of the second material-comprising pillars; and after forming the sidewall spacers, removing the second material-comprising pillars to form a pattern comprising the sidewall spacers having openings therein where the second material-comprising pillars were removed and having the interstitial spaces.

30. The method of claim 29 wherein the openings in the first material before and after the widening do not extend into the second material.

31. The method of claim 29 comprising substrate material elevationally inward of the second material that is of different composition from that of the second material, the etching into the second material to form the second material-comprising pillars not etching completely through the second material to form the second material-comprising pillars to project integrally elevationally outward from the second material.

32. The method of claim 29 wherein at conclusion of forming the second material-comprising pillars, no first material remains over the second material-comprising pillars.

33. The method of claim 29 comprising substrate material elevationally inward of the second material that is of different composition from that of the second material, the removing of the pillars comprising etching through the second material to the substrate material.

34. The method of claim 29 comprising forming the second material to comprise different composition elevationally outer and inner materials.

35. The method of claim 34 wherein etching into the second material to form the second material-comprising pillars comprises:

etching the outer material selectively relative to the inner material; and thereafter, etching the inner material.

36. The method of claim 34 wherein the removing of the pillars comprises:

etching the outer material selectively relative to the inner material; and thereafter, etching the inner material.

37. The method of claim 29 using the sidewall spacers having openings therein where the second material-comprising pillars were removed and having the interstitial spaces as a mask while processing material that is elevationally inward of the sidewall spacers through said openings and spaces.

38. The method of claim 37 wherein the processing comprises etching into the material that is elevationally inward of the sidewall spacers through said openings and spaces.

39. The method of claim 29 wherein the openings where the second material-comprising pillars were removed are in an oblique lattice pattern and the interstitial spaces in combination with the openings where the second material-comprising pillars were removed are in a square lattice pattern.

40. The method of claim wherein 15 wherein the processing comprises etching into substrate material beneath the second material through the first and second openings in the second material, the first openings being of a first horizontal cross sectional shape prior to said etching into substrate material beneath the second material, the second openings being of a second horizontal cross sectional shape prior to said etching into substrate material beneath the second material and that is different from the first horizontal cross sectional shape, said etching into substrate material beneath the second material changing the second horizontal cross-sectional shape of the second openings.

41. The method of claim 40 wherein said etching into substrate material beneath the second material does not change the first horizontal cross-sectional shape of the first openings.

42. The method of claim 40 wherein prior to said etching into substrate material beneath the second material the second openings comprise four concave sidewall portions, said etching into substrate material beneath the second material forming the second openings to comprise four convex sidewall portions.

43. The method of claim wherein 25 wherein the first openings are of a first horizontal cross sectional shape prior to said etching into substrate material beneath the second material, the second openings being of a second horizontal cross sectional shape prior to said etching into substrate material beneath the second material and that is different from the first horizontal cross sectional shape, said etching into substrate material beneath the second material changing the second horizontal cross-sectional shape of the second openings.

44. The method of claim 43 wherein said etching into substrate material beneath the second material does not change the first horizontal cross-sectional shape of the first openings.

45. The method of claim 43 wherein prior to said etching into substrate material beneath the second material the second openings comprise four concave sidewall portions, said etching into substrate material beneath the second material forming the second openings to comprise four convex sidewall portions.

46. The method of claim wherein 38 wherein the first openings are of a first horizontal cross sectional shape prior to said etching into substrate material beneath the second material, the second openings being of a second horizontal cross sectional shape prior to said etching into substrate material beneath the second material and that is different from the first horizontal cross sectional shape, said etching into substrate material beneath the second material changing the second horizontal cross-sectional shape of the second openings.

47. The method of claim 46 wherein said etching into substrate material beneath the second material does not change the first horizontal cross-sectional shape of the first openings.

48. The method of claim 46 wherein prior to said etching into substrate material beneath the second material the second openings comprise four concave sidewall portions, said etching into substrate material beneath the second material forming the second openings to comprise four convex sidewall portions.

* * * * *

UNITED STATES PATENT AND TRADEMARK OFFICE
CERTIFICATE OF CORRECTION

PATENT NO. : 8,889,558 B2
APPLICATION NO. : 13/712820
DATED : November 18, 2014
INVENTOR(S) : Ranjan Khurana et al.

It is certified that error appears in the above-identified patent and that said Letters Patent is hereby corrected as shown below:

In the Claims

Column 12, line 66, in Claim 40, delete "claim wherein 15 wherein" and insert -- claim 15 wherein --, therefor.
Column 13, line 22, in Claim 43, delete "claim wherein 25 wherein" and insert -- claim 25 wherein --, therefor.
Column 14, line 11, in Claim 46, delete "claim wherein 38 wherein" and insert -- claim 38 wherein --, therefor.

Signed and Sealed this
Twenty-fourth Day of February, 2015

Michelle K. Lee
*Deputy Director of the United States Patent and Trademark Office*